(12) United States Patent
Chawla et al.

(10) Patent No.: US 10,830,877 B1
(45) Date of Patent: Nov. 10, 2020

(54) LOW NOISE FRONTENDS FOR LIDAR RECEIVER AND METHODS FOR CONTROLLING THE SAME COMPRISING A MULTIPLEXING CIRCUIT FOR SELECTIVELY CONNECTING EACH PHOTODETECTOR TO A SHARED AMPLIFIER

(71) Applicant: BEIJING VOYAGER TECHNOLOGY CO., LTD., Beijing (CN)

(72) Inventors: Vipul Chawla, Mountain View, CA (US); Yue Lu, Los Gatos, CA (US); Lingkai Kong, Mountain View, CA (US)

(73) Assignee: BEIJING VOYAGER TECHNOLOGY CO., LTD., Beijing (CN)

( * ) Notice: Subject to any disclaimer, the term of this patent is extended or adjusted under 35 U.S.C. 154(b) by 0 days.

(21) Appl. No.: 16/920,647

(22) Filed: Jul. 3, 2020

Related U.S. Application Data

(63) Continuation of application No. PCT/US2019/043534, filed on Jul. 25, 2019.

(51) Int. Cl.
*H03F 3/45* (2006.01)
*G01S 7/4863* (2020.01)

(52) U.S. Cl.
CPC ........ *G01S 7/4863* (2013.01); *H03F 3/45475* (2013.01); *H03F 2200/129* (2013.01); *H03F 2203/45528* (2013.01)

(58) Field of Classification Search
CPC .... H03F 3/08; H03F 3/45475; H03F 3/45928; H03F 3/68; G01V 8/20
USPC .......................................... 250/214 R, 214 A
See application file for complete search history.

(56) References Cited

U.S. PATENT DOCUMENTS 10,020,069 B2 * 7/2018 Huang ................. G11C 27/026

* cited by examiner

*Primary Examiner* — Que Tan Le
(74) *Attorney, Agent, or Firm* — Bayes PLLC

(57) ABSTRACT

An optical signal detection system includes a plurality of photodetectors configured to detect optical signals reflected from an environment surrounding the optical signal detection system and convert the optical signals into electrical signals. The optical signal detection system also includes an amplifier coupled to the plurality of photodetectors. The amplifier is shared by the plurality of photodetectors and configured to generate an output signal by amplifying an individual electrical signal converted by a corresponding photodetector. The optical signal detection system further includes a multiplexing circuit configured to selectively establish a connection between one of the plurality of photodetectors and the amplifier to amply the electrical signal converted by that photodetector.

20 Claims, 8 Drawing Sheets

US 10,830,877 B1

LOW NOISE FRONTENDS FOR LIDAR RECEIVER AND METHODS FOR CONTROLLING THE SAME COMPRISING A MULTIPLEXING CIRCUIT FOR SELECTIVELY CONNECTING EACH PHOTODETECTOR TO A SHARED AMPLIFIER

CROSS-REFERENCE TO RELATED APPLICATION

This application is a continuation of PCT Application No. PCT/US2019/043534, filed Jul. 25, 2019, the entire contents of which are expressly incorporated herein by reference.

TECHNICAL FIELD

The present disclosure relates to optical signal detection devices such as a light detection and ranging (LiDAR) device, and more particularly, to low-noise amplifiers used to amplify electrical signals converted from optical signals detected by the optical signal detection devices.

BACKGROUND

Optical signal detection systems such as LiDAR systems have been widely used in autonomous driving and producing high-definition maps. For example, a typical LiDAR system measures distance to a target by illuminating the target with pulsed laser light and measuring the reflected pulses with a sensor such as a photodetector. Differences in laser light return times and/or wavelengths and/or phase can then be used to make digital three-dimensional (3D) representations of the target. The laser light used for LiDAR scan may be ultraviolet, visible, or near infrared. Because using a narrow laser beam as the incident light can map physical features with very high resolution, a LiDAR system is particularly suitable for applications such as sensing in autonomous driving and/or high-definition map surveys.

Optical signals such as the laser light detected by a LiDAR system can be converted to electrical signals by, for example, photodetectors, before being processed by other components of the LiDAR system. The electrical signals generated by photodetectors are normally very small and need to be amplified. When multiple photodetectors are used, conventional LiDAR systems use multiple amplifiers, for example, one amplifier corresponding to one photodetector, to amplify the electrical signals. Using multiple amplifiers is costly and may cause other problems such as high power consumption, large footprints, inconsistency among different amplifiers, etc. Efforts for reducing the number of amplifiers remain largely unsuccessful because it is challenging to share an amplifier among multiple photodetectors. For example, the noise associated with switching among different photodetectors is normally too high compared with the electrical signals need to be amplified.

Embodiments of the disclosure address the above problems by providing a low-noise amplifier shared by multiple photodetectors or a low-noise multi-channel amplifier used in an optical signal detection system.

SUMMARY

Embodiments of the disclosure provide an optical signal detection system. The optical signal detection system includes a plurality of photodetectors configured to detect optical signals reflected from an environment surrounding the optical signal detection system and convert the optical signals into electrical signals. The optical signal detection system also includes an amplifier coupled to the plurality of photodetectors, wherein the amplifier is shared by the plurality of photodetectors and configured to generate an output signal by amplifying an individual electrical signal converted by a corresponding photodetector. The optical signal detection system further includes a multiplexing circuit configured to selectively establish a connection between one of the plurality of photodetectors and the amplifier to amply the electrical signal converted by that photodetector.

Embodiments of the disclosure also provide a method of processing optical signals. The method includes detecting, by a plurality of photodetectors, the optical signals reflected from an environment surrounding the optical signal detection system and converting, by the plurality of photodetectors, the optical signals into electrical signals. The method also includes selectively establishing, by a multiplexing circuit, a connection between one of the plurality of photodetectors and an amplifier. The amplifier is coupled to and shared by the plurality of photodetectors. The method further includes generating, by the amplifier, an output signal by amplifying an individual electrical signal converted by the photodetector establishing the connection with the amplifier.

Embodiments of the disclosure further provide a multi-channel operational amplifier circuit. The multi-channel operational amplifier circuit includes a plurality of input channels configured to receive input signals generated by a plurality of photodetectors. The multi-channel operational amplifier also includes an amplification unit coupled to the plurality of photodetectors through the plurality of input channels. The amplification unit is shared by the plurality of input channels and configured to generate an output signal by amplifying an individual input signal received by a corresponding input channel. The multi-channel operational amplifier circuit further includes a multiplexing circuit configured to select one of the plurality of input channels for the amplification unit to amply the input signal received by that input channel.

It is to be understood that both the foregoing general description and the following detailed description are exemplary and explanatory only and are not restrictive of the invention, as claimed.

DETAILED DESCRIPTION

Reference will now be made in detail to the exemplary embodiments, examples of which are illustrated in the accompanying drawings. Wherever possible, the same reference numbers will be used throughout the drawings to refer to the same or like parts.

An optical signal detection system such as a LiDAR system may use multiple detectors such as photodetectors or a photodetector array to detect optical signals (e.g., laser light) reflected by objects. For example, a photodetector can convert optical signals to electrical signals such as current signals or voltage signals. The electrical signals may be amplified by an amplifier such as a transimpedance amplifier (TIA). To ensure a certain level of signal-to-noise ratio (SNR), the amplifier should have low noise. For example, the electrical signals need to be amplified should not be smaller than the noise floor of the amplifier. A typical approach is to use multiple amplifiers (one for each photodetector) to amplify the electrical signals, followed by a multiplexer to select one of the amplified electrical signals to an output. However, this approach suffers from high power consumption, large footprints, high bill of material because of the large number of amplifiers. Also, requirements on multiplexer linearity is often stringent due to large signal swing at each amplifier's output.

Embodiments of the present disclosure provide improved optical signal detection system having a low-noise amplifier shared by multiple photodetectors to reduce the number of amplifiers needed at a receiver frontend (e.g., a portion of the receiver where optical signals are converted to electrical signals and then amplified for further processing). For example, the amplifier may be selectively connected to individual photodetectors by a multiplexing circuit, thereby shared by multiple photodetectors. In another example, the amplifier may take the form of a multi-channel amplifier capable of receiving electrical signals from multiple connected photodetectors (e.g., from one photodetector at a time). Either way, the number of amplifiers needed to amplify the electrical signals can be greatly reduced, lowering the bill of material and reducing the power consumption and device footprints.

Figure 1:
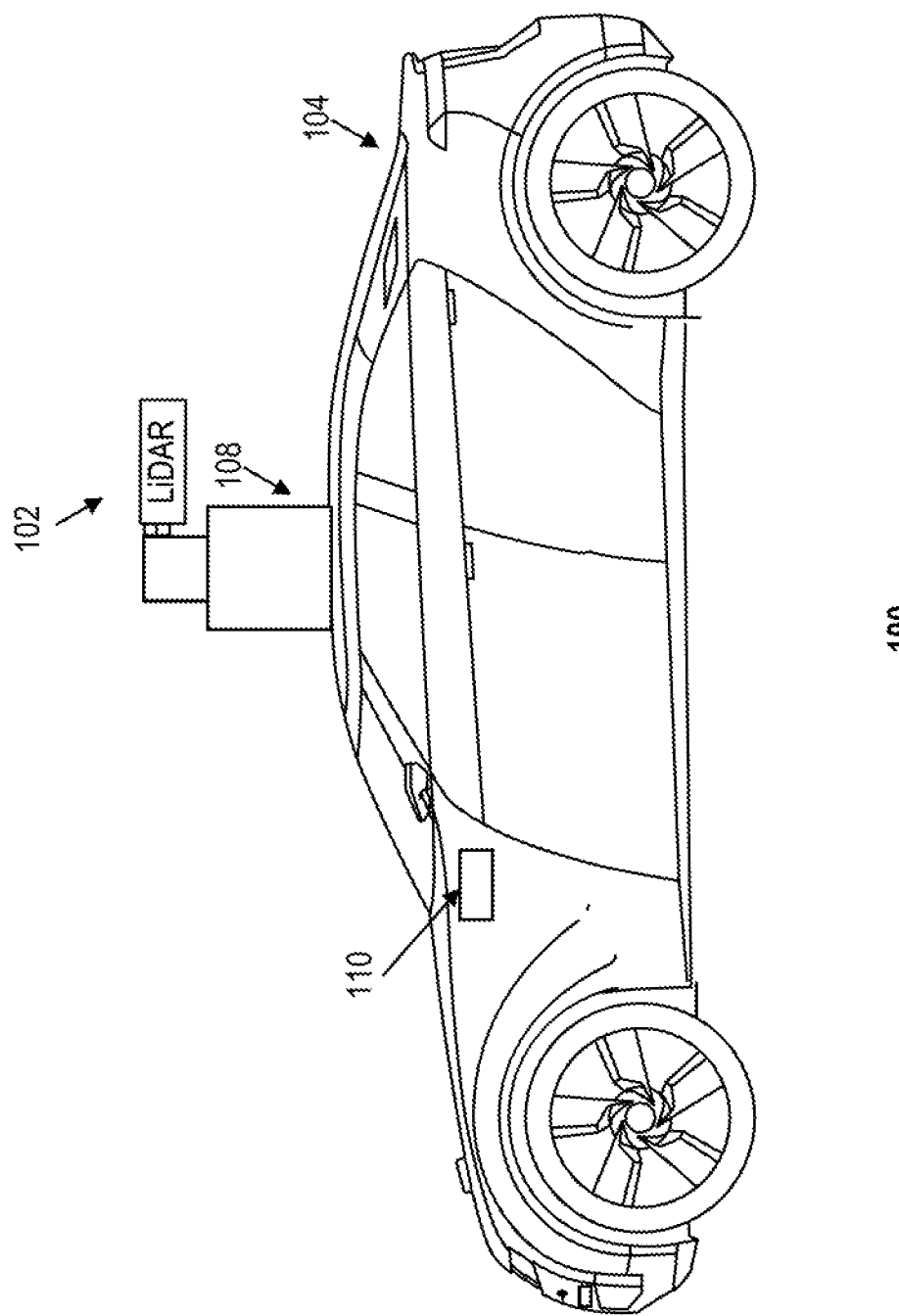
FIG. 1 illustrates a schematic diagram of an exemplary vehicle equipped with a LiDAR optical signal detection system, according to embodiments of the disclosure.

FIG. 1 illustrates a schematic diagram of an exemplary vehicle 100 equipped with a LiDAR optical signal detection system 102 (or LiDAR system 102 for simplicity), according to embodiments of the disclosure. Consistent with some embodiments, vehicle 100 may be an autonomous driving vehicle or a survey vehicle configured for acquiring data for constructing a high-definition map or 3D buildings and city modeling.

As illustrated in FIG. 1, vehicle 100 may be equipped with LiDAR system 102 mounted to a body 104 via a mounting structure 108. Mounting structure 108 may be an electromechanical device installed or otherwise attached to body 104 of vehicle 100. In some embodiments of the present disclosure, mounting structure 108 may use screws, adhesives, or another mounting mechanism. Vehicle 100 may be additionally equipped with a sensor 110 inside or outside body 104 using any suitable mounting mechanisms. Sensor 110 may include sensors used in a navigation unit, such as a Global Positioning System (GPS) receiver and one or more Inertial Measurement Unit (IMU) sensors. It is contemplated that the manners in which LiDAR system 102 or sensor 110 can be equipped on vehicle 100 are not limited by the example shown in FIG. 1 and may be modified depending on the types of LiDAR system 102 and sensor 110 and/or vehicle 100 to achieve the desirable sensing performance.

Consistent with some embodiments, LiDAR system 102 and sensor 110 may be configured to capture data as vehicle 100 moves along a trajectory. For example, a transmitter of LiDAR system 102 is configured to scan the surrounding and acquire point clouds. LiDAR system 102 may include one or more LiDAR sensing devices configured to measure distance to a target by illuminating the target with pulsed laser beams and measuring the reflected pulses with a receiver. The laser beams used by LiDAR system 102 may be ultraviolet, visible, or near infrared. In some embodiments of the present disclosure, LiDAR system 102 may capture point clouds. As vehicle 100 moves along the trajectory, LiDAR system 102 may continuously capture data. Each set of data captured at a certain time range is known as a data frame.

Figure 2:
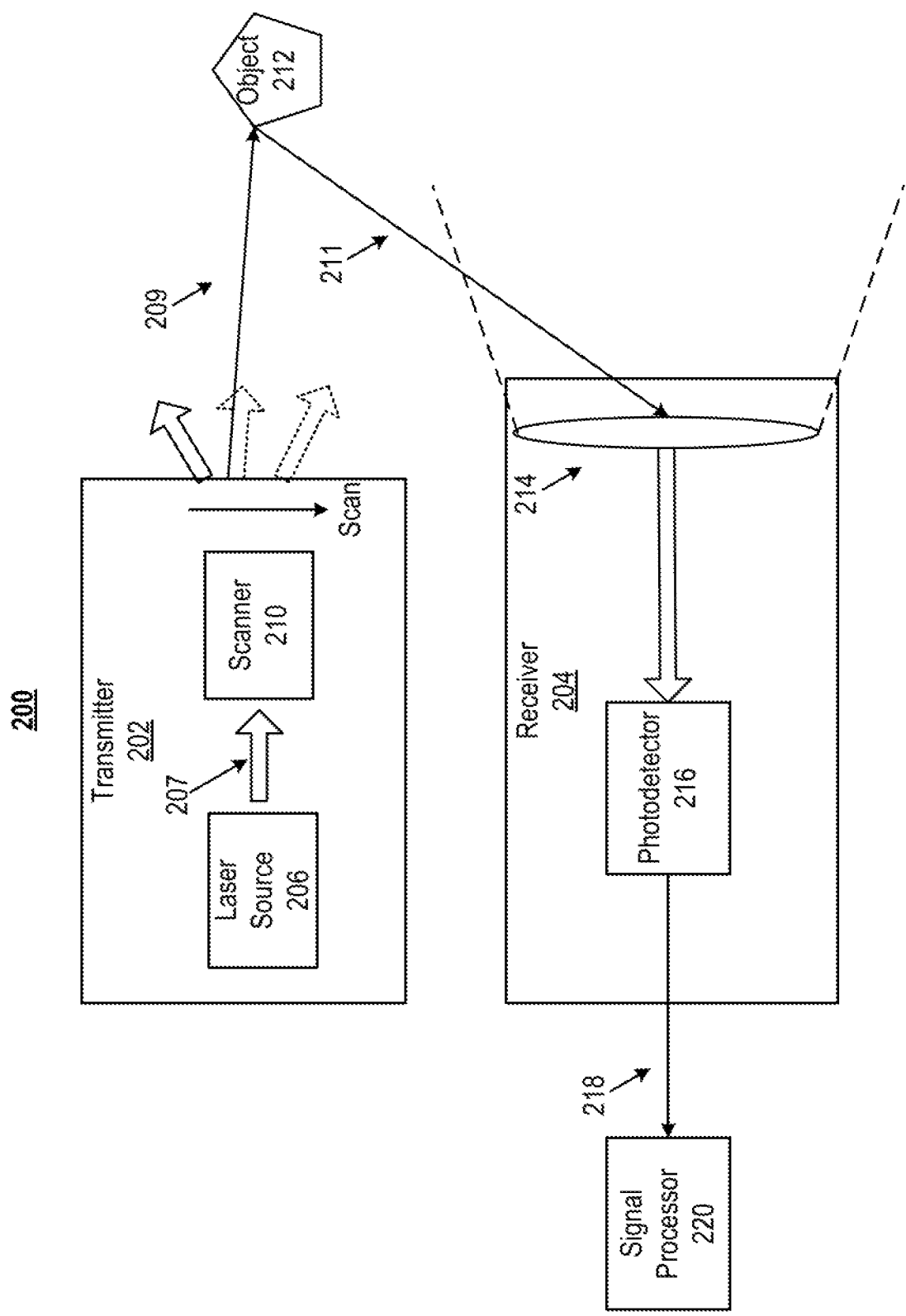
FIG. 2 illustrates a block diagram of an exemplary LiDAR optical signal detection device having a transmitter and a receiver, according to embodiments of the disclosure.

FIG. 2 illustrates a block diagram of an exemplary LiDAR optical signal detection device 200 (or LiDAR device 200 for simplicity), such as that used in LiDAR system 102. LiDAR device 200 may include a transmitter 202 and a receiver 204. Transmitter 202 may emit laser beams within a scan angle as it moves (e.g., rotates, swings, etc.). Transmitter 202 may include one or more laser sources 206 and a scanner 210. In some embodiments, laser sources 206 and scanner 210 may be separate devices or components. In other embodiments, laser sources 206 and scanner 210 may be integrated as a single device/component.

In some embodiments, transmitter 202 can sequentially emit a stream of pulsed laser beams in different directions within its scan angle as it moves (e.g., rotates, swings, etc.), as illustrated in FIG. 2. Laser source 206 may be configured to provide a laser beam 207 (also referred to as a "native laser beam") in a respective incident direction to scanner 210. In some embodiments, laser source 206 may be disposed within scanner 210 or integrated with scanner 210 (e.g., scanner 210 forms a rotator for scanning the environment). In some embodiments of the present disclosure, laser source 206 may generate a pulsed laser beam in the ultraviolet, visible, or near infrared wavelength range.

In some embodiments of the present disclosure, laser source 206 may include a pulsed laser diode (PLD), a vertical-cavity surface-emitting laser (VCSEL), a fiber laser, etc. For example, a PLD may be a semiconductor device similar to a light-emitting diode (LED) in which the laser beam is created at the diode's junction. In some embodiments of the present disclosure, a PLD includes a PIN diode in which the active region is in the intrinsic (I) region, and the carriers (electrons and holes) are pumped into the active region from the N and P regions, respectively. Depending on the semiconductor materials, the wavelength of incident laser beam 207 provided by a PLD may be smaller than 1,100 nm, such as 405 nm, between 445 nm and 465 nm, between 510 nm and 525 nm, 532 nm, 635 nm, between 650 nm and 660 nm, 670 nm, 760 nm, 785 nm, 808 nm, or 848 nm. It is understood that any suitable laser source may be used as laser source 206 for emitting laser beam 207.

Scanner 210 may be configured to emit a laser beam 209 to an object 212 in a first direction. In some embodiments, laser beam 209 may be the same as laser beam 207 when a scanner (e.g., a MEMS scanner) is not used or when a rotator scanner is integrated with laser source 206. Object 212 may be made of a wide range of materials including, for example, non-metallic objects, rocks, rain, chemical compounds, aerosols, clouds and even single molecules. The wavelength of laser beam 209 may vary based on the composition of object 212. In some embodiments, at each time point during the scan, scanner 210 may emit laser beam 209 to object 212 in a direction within the scan angle by rotating a micromachined mirror assembly as the incident angle of incident laser beam 207 may be fixed, as well as rotating moving part 200. In some embodiments of the present disclosure, scanner 210 may also include optical components (e.g., lenses, mirrors, etc.) that can focus pulsed laser light into a narrow laser beam to increase the scan resolution and the range to scan object 212.

In some embodiments, receiver 204 may be configured to detect a returned laser beam 211 returned from object 212. The returned laser beam 211 may be in a different direction from beam 209. Receiver 204 can collect laser beams returned from object 212 and output electrical signal reflecting the intensity of the returned laser beams. Upon contact, laser light can be reflected by object 212 via backscattering, such as Rayleigh scattering, Mie scattering, Raman scattering, and fluorescence. As illustrated in FIG. 2, receiver 204 may include a lens 214 and a photodetector 216. Lens 214 may be configured to collect light from a respective direction in its field of view (FOV). At each time point during the scan, returned laser beam 211 may be collected by lens 214. Returned laser beam 211 may be returned from object 212 and have the same wavelength as laser beam 209.

Photodetector 216 may be configured to detect returned laser beam 211 returned from object 212. In some embodiments, photodetector 216 may convert a laser light (e.g., returned laser beam 211) collected by lens 214 into an electrical signal 218 (e.g., a current or a voltage signal). Electrical signal 218 may be generated when photons are absorbed in a photodiode included in photodetector 216. In some embodiments of the present disclosure, photodetector 216 may include a PIN detector, a PIN detector array, an avalanche photodiode (APD) detector, a APD detector array, a single photon avalanche diode (SPAD) detector, a SPAD detector array, a silicon photo pultiplier (SiPM/MPCC) detector, a SiP/MPCC detector array, or the like.

While scanner 210 is described herein as part of transmitter 202, it is understood that in some embodiments, scanner 210 can also be included in receiver 204, e.g., before photodetector 216 in the light path. The inclusion of scanner 210 in receiver 204 can ensure that photodetector 216 only captures light, e.g., returned laser beam 211 from desired directions, thereby avoiding interferences from other light sources, such as the sun and/or other LiDAR systems. By increasing the aperture of receiver 204, the sensitivity of photodetector 216 can be increased as well.

In some embodiments, LiDAR device 200 may include a signal processor 220 configured to process electrical signal 218. For example, signal processor 220 may include an analog to digital converter to convert electrical signal 218 that may be an analog signal to a digital signal. In another example, signal processor 220 may include one or more filters, noise reducers, signal enhancer, or the like to improve the signal-to-noise ratio (SNR) of electrical signal 218. Signal processor 220 may include a microprocessor, a digital signal processor (DSP), a microcontroller, a field programmable gate array (FPGA), and/or other suitable devices or chips capable of processing electrical signal 218.

Figure 3:
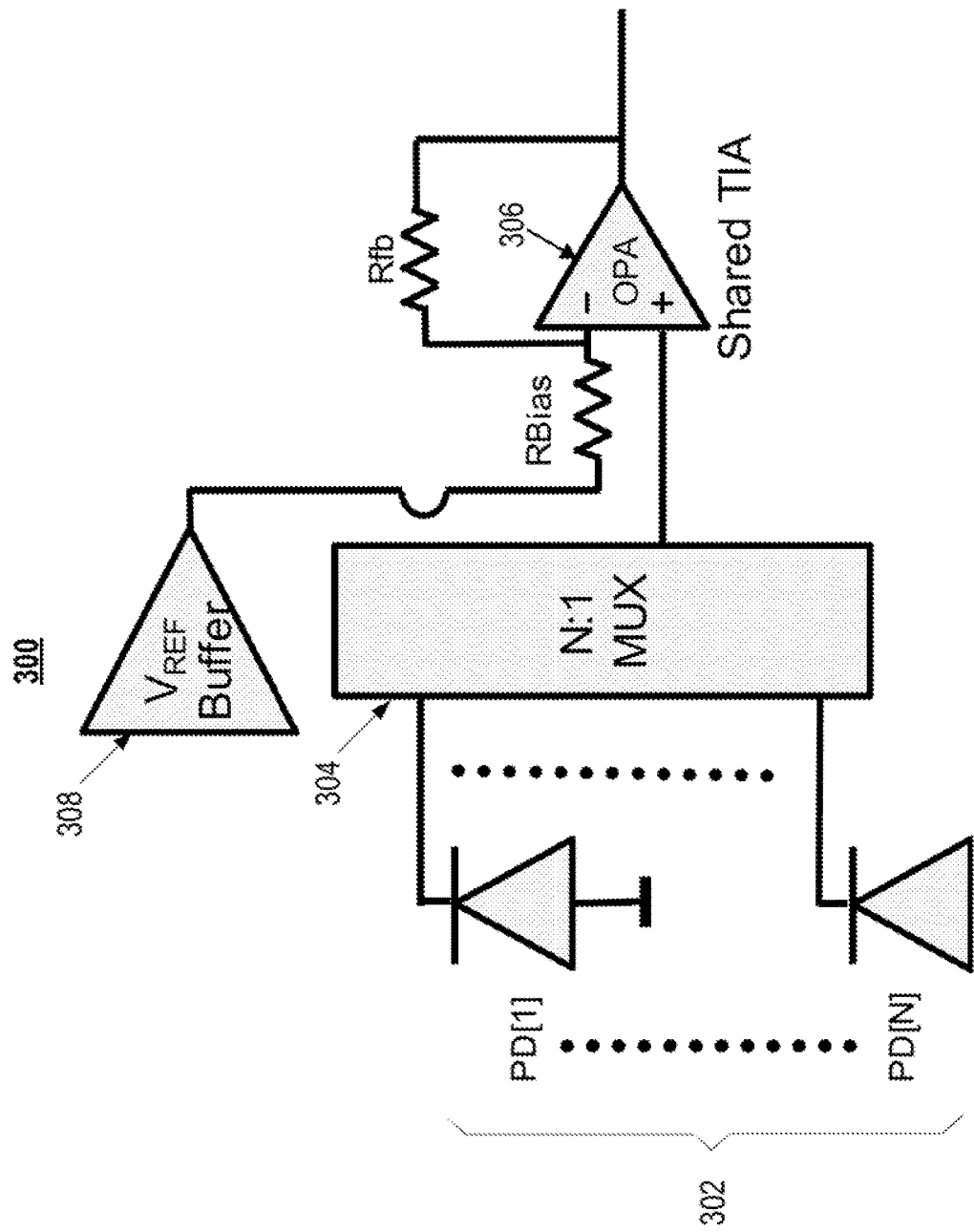
FIG. 3 illustrates a circuit diagram of an exemplary optical signal detection circuit having a shared amplifier, according to embodiments of the disclosure.

FIG. 3 illustrates a circuit diagram of an exemplary optical signal detection circuit 300 with a shared amplifier (e.g., TIA), according to embodiments of the disclosure. Circuit 300 may also be referred to as LiDAR receiver frontend 300 when used in a LiDAR device. Circuit 300 shown in FIG. 3 may be part of receiver 204 and may be configured for receiver 204 to process electrical signal 218 generated based on receiving/detecting returned laser beam 211. In some embodiments, electrical signal 218 converted by photodetector 216 of receiver 204 may be further converted (e.g., from a current signal to a voltage signal) and/or amplified to a larger electrical signal for other parts of LiDAR device 200 to process. For example, the amplified electrical signal of electrical signal 218 may be used to generate point clouds or data frames reflecting the surrounding environment of LiDAR device 200.

Different from a typical multi-channel LiDAR receiver frontend where each channel includes an individual amplifier (e.g., a TIA), LiDAR receiver frontend 300 utilizes a multiplexing circuit (also referred to as a multiplexer) before a shared TIA (e.g., the multiplexer is built in to LiDAR receiver frontend 300). Because the TIA is connected to the output of the multiplexer, a reduced number of TIA is needed (e.g., only one TIA shared by all of the channels) compared to a typical multi-channel LiDAR receiver frontend. Thus, the power consumption, the system size, and the bill of materials of the LiDAR system utilizing LiDAR receiver frontend 300 can be reduced. Also, because of the potential large signal swing at the TIA outputs, using a multiplexer before the shared TIA instead of after each of the multiple TIAs can significantly lower the requirements on multiplexer's linearity.

As illustrated in FIG. 3, LiDAR receiver frontend 300 may include multiple detectors (e.g., a photodetector array 302), a multiplexer 304 and an operational amplifier 306 (e.g., a TIA operational amplifier). Photodetector array 302 may include multiple photodetectors for detecting/receiving the reflected laser lights (e.g., returned laser beam 211) reflected by object 212. For example, photodetector array 302 may include N (e.g., N is larger than 1, 2, 3, 5, 10, 20, etc.) photodetectors arranged in a row or any suitable manner for detecting the returned laser light. The number of photodetectors in photodetector array 302 may depend on the scanning range and the scanning mechanism (e.g., full-coaxial or semi-coaxial, etc.) of the LiDAR system.

The photodetectors in photodetector array 302 may be configured to detect returned laser beam 211 returned from object 212. Each of the photodetectors in photodetector array 302 may convert the returned laser light (e.g., returned laser beam 211) collected by lens 214 into an electrical signal 218 (e.g., a current or a voltage signal). For example, a current signal may be generated when photons are absorbed in the photodiode of one of the photodetectors. In some embodiments of the present disclosure, each photodetector of photodetector array 302 may also be an avalanche photodiode (APD), such as a single photon avalanche diode (SPAD) or a photon avalanche diode array, or a silicon photo multiplier (SiPM).

Multiplexer 304 may be electrically connected to photodetector array 302 and operational amplifier 306. In some embodiments, multiplexer 304 may be an electronic multiplexer or a digital multiplexer that selects between several input signals (e.g., current input from one of the photodetectors in photodetector array 302 or digital input from one of the N-input channels) and forwards the output generated based on the selected input to operational amplifier 306 for further processing, such as amplification of the signal. For example, multiplexer 304 may establish a connection between a selected photodetector or an input channel and amplifier 306 such that the signals may pass through multiplexer 304 and reach the input of amplifier 306. In some other embodiments, multiplexer 304 may also be a multiple-input, single-output switch, where only one input from the N-input channels can be selected and output to operational amplifier 306 for further processing.

In some embodiments, operational amplifier 306 may be a DC-coupled high-gain electronic voltage amplifier configured to amplify the differential input $V_+$ and $V_-$. For example, the output of the operational amplifier 306 may be given by equation (1):

$$V_{out}=A_g*(V_+-V_-) \qquad (1)$$

where $A_g$ is the gain of operational amplifier 306, $(V_+-V_-)$ is the differential input voltage to the operational amplifier 306.

In some embodiments, operational amplifier 306 may be an open-loop amplifier where a very large magnitude of $A_g$ (e.g., a 100,000 times gain) is desired. For example, operational amplifier 306 may include a resistor $R_{Bias}$ at the non-inverting input held at a reference voltage (e.g., $V_+=0$), and the input voltage applied to the inverting input (e.g., the single output of multiplexer 304) may be amplified to the maximum extent (e.g., to the maximum positive if the input voltage is positive or to the maximum negative if the input voltage is negative). In these embodiments, operational amplifier 306 may act as a comparator comparing electrical signal 218 and 0V.

In some embodiments, because electrical signal 218 (e.g., the input of multiplexer 304) is predictable, operational amplifier 306 may include a negative feedback (will be disclosed in greater detail below) by applying a portion of the output voltage of operational amplifier 306 to the inverting input using a feedback network. Such a feedback transforms the operational amplifier into a trans-impedance amplifier (TIA). The negative feedback may be used to control the gain. For example, the gain $A_{g,TIA}$ of the TIA may be mostly controlled by the design of the feedback network, which in this case is Rfb. The gain $A_{g,TIA}$ of operational amplifier 306 may be given by equation (2):

$$A_{g,TIA}=R_{fb} \qquad (2)$$

In some embodiments, instead of holding the non-inverting input at a reference voltage (e.g., $V_+=0$), operational amplifier 306 may include a buffer 308 used for further controlling and stabilizing the gain $A_g$ of operational amplifier 306.

Figure 4A:
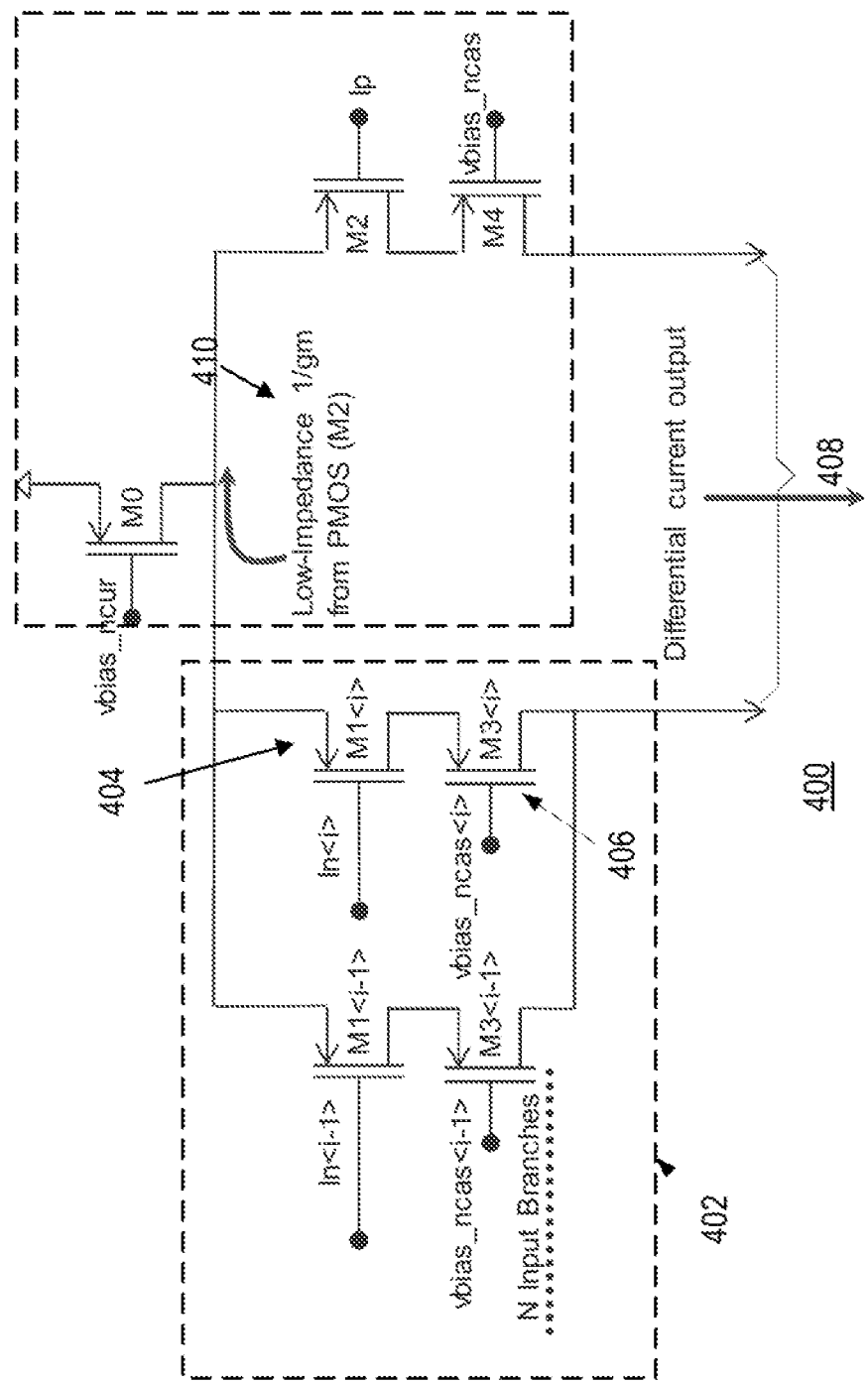
FIG. 4A illustrates a circuit diagram of an exemplary optical signal detection circuit having a multi-channel amplifier, according to embodiments of the disclosure.
Figure 4B:
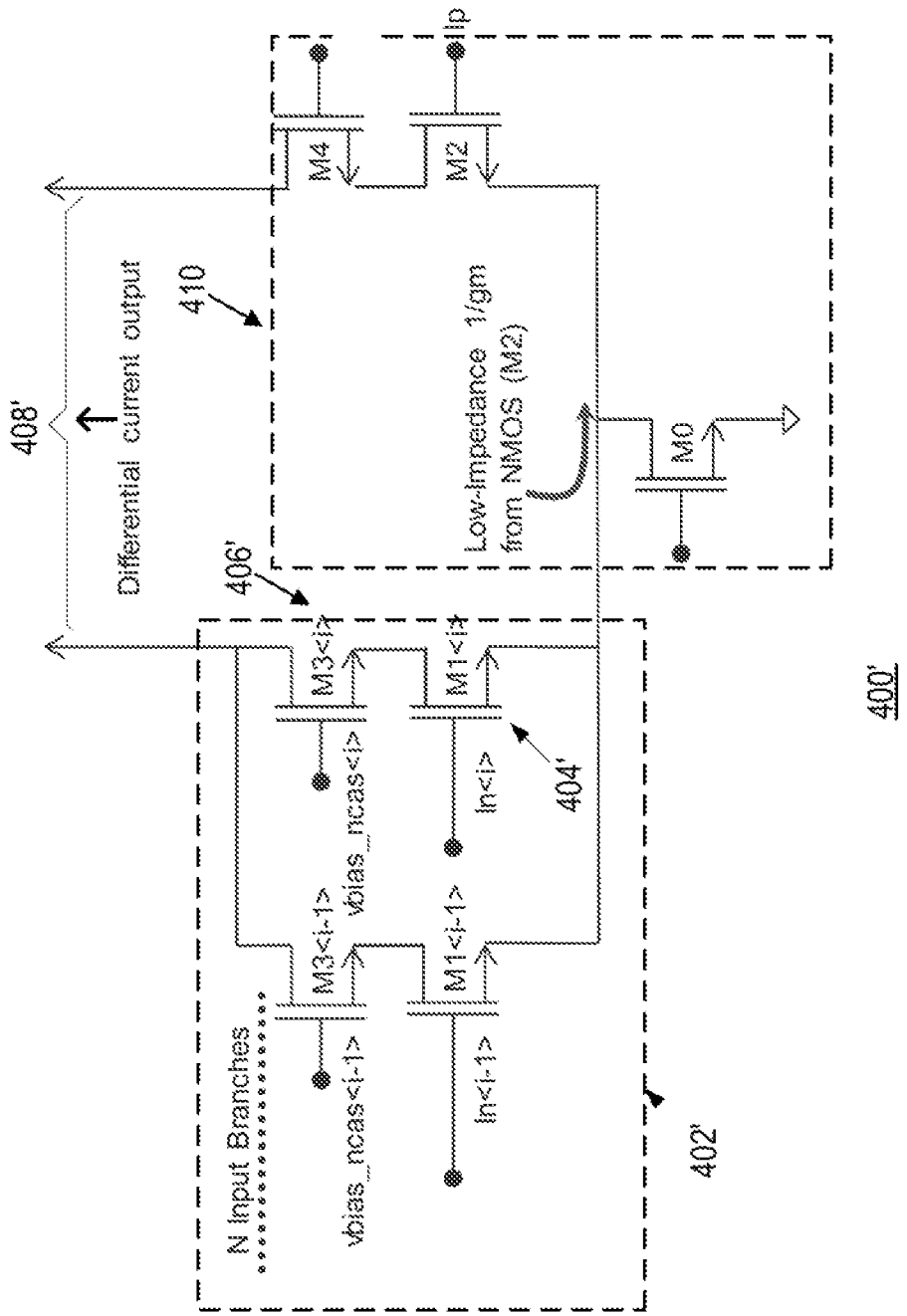
FIG. 4B illustrates a circuit diagram of another exemplary optical signal detection circuit having a multi-channel amplifier, according to embodiments of the disclosure.

FIGS. 4A-4B illustrate circuit diagrams of exemplary optical signal detection circuits having multi-channel amplifiers, according to embodiments of the disclosure. As illustrated in FIG. 4A, an optical signal detection circuit 400 may include a plurality of input branches 402 arranged in parallel. Each of the plurality of input branches may be coupled to one of the plurality of photodetectors. In some embodiments, each of the input branches may include an input transistor 404 and a switch 406. The plurality of switches 406 may form a multiplexing circuit configured to selectively establish a connection between one of the photodetectors and an amplifier of circuit 400 (e.g., the differential input via input transistor M1). Switch 406 may be configured to control the connection between one of the photodetectors and the amplifier of circuit 400. For example, when switch 406 of the ith input branch (M3<i>) turns on, the electrical signal converted by the photodetector coupled to the gate terminal of input transistor M1<i> is selected to be amplified.

For example, as illustrated in FIG. 4A, input transistor 404 and switch 406 may be N-type metal-oxide-semiconductor logic (NMOS) devices. Input transistor 404 may be electrically coupled with one of the photodetectors in photodetector array 302. Switch 406 may be arranged in series with input transistor in an input branch. When one of the photodetectors in photodetector array 302 detects returned laser beam 211 returned from object 212 (e.g., light photons reflected by object 212), the receiving photodetector may convert the received light photons into electrical signal 218 (e.g., a current signal and/or a voltage signal) and transmit electrical signal 218 to the gate terminal of input transistor 404. When the switch 406 connected in series with the input transistor in the same input branch turns on, the electrical signal 218 at the gate terminal of input transistor 404 may be selected for amplification. Switches 406 of the input branches can turn on one at a time to control the selection of the corresponding input transistor 404, thereby establishing the connection between the corresponding photodetector and the amplifier. In some embodiments, the sequence of the on and off of different switches 406 is predetermined or pre-programed based on the scanning manner of LiDAR device 200.

In some embodiments, optical signal detection circuit 400 may further include a non-inverting input branch 410 that includes at least one NMOS device to generate another input for operational amplifier 306 (e.g., the other one of the differential inverting input $V_+$) for further processing purpose. In some embodiments, circuit 400 may further include an active P-type metal-oxide-semiconductor logic (PMOS) current mirror loads at the end of differential current output 408 (e.g., M5 and M6 in FIG. 5). For example, the PMOS current mirror loads may be configured to convert the differential output of circuit 400 (e.g., differential current output 408) to a single-ended output.

FIG. 4B shows another optical signal detection circuit 400'. As illustrated in FIG. 4B, input transistor 404' and switch 406' may be PMOS devices, where input transistor 404' is electrically coupled with one of the photodetectors in photodetector array 302 and switch 406' is electrically coupled with the output of modified N-input branches 402'. Switch 406' may be arranged in series with input transistor in an input branch. When one of the photodetector in photodetector array 302 detects returned laser beam 211 returned from object 212 (e.g., light photons reflected by object 212), the photodetector may convert the received light photons into electrical signal 218 (e.g., a current signal and/or a voltage signal) and transmit electrical signal 218 to the gate terminal of input transistor 404' may be selected for amplification. Similar to N-channel input with a built-in multiplexer 400' illustrated in FIG. 4A, when the switch 406' connected in series with the input transistor in the same input branch turns on, the electrical signal 218 at the gate terminal of input transistor 404' may be selected for amplification. Switches 406' of the input branches can turn on one at a time to control the selection of the corresponding input transistor 404', thereby establishing the connection between the corresponding photodetector and the amplifier. In some embodiments, the sequence of the on and off of different switches 406' is predetermined or pre-programed based on the scanning manner of LiDAR device 200.

In some embodiments, optical signal detection circuit 400' may further include a non-inverting input branch 410' that includes at least one PMOS device for generating another input for operational amplifier 306 (e.g., the other one of the differential inverting input $V_+$) for further processing purpose. In some embodiments, circuit 400' may further include an active NMOS current mirror load at the end of differential current output 408' (e.g., similar to M5 and M6 in FIG. 5). For example, the NMOS current mirror loads may be configured to convert the differential output of circuit 400' (e.g., differential current output 408') to single-ended output.

Because the input multiplexing functionality is achieved without a series switch at the "gate" terminal of input transistor 404, each of the N-switchable input branches provide the same low noise amplification performance as of a conventional single differential input operational amplifier. On one side, the N input branches connect together at the "source" terminal of transistors M1<i>, which is a low impedance "virtual ground" node of the optical signal detection circuit 404. On the other side, the N input branches connect together at "drain" terminal of transistor M3<i>. In the embodiment illustrated in FIG. 5, this node connects to diode-connected PMOS transistor M5 which also provides a low-impedance at the connection point. The presence of low impedance nodes at either side of the N-input branches makes the impact of multiple parallel branches on the bandwidth of optical signal detection circuit 400 negligible. Overall, this would lower the noise and increase the signal-to-noise ratio of circuit 400, thereby increasing the overall performance of the optical detection (e.g., LiDAR) system.

Figure 5:
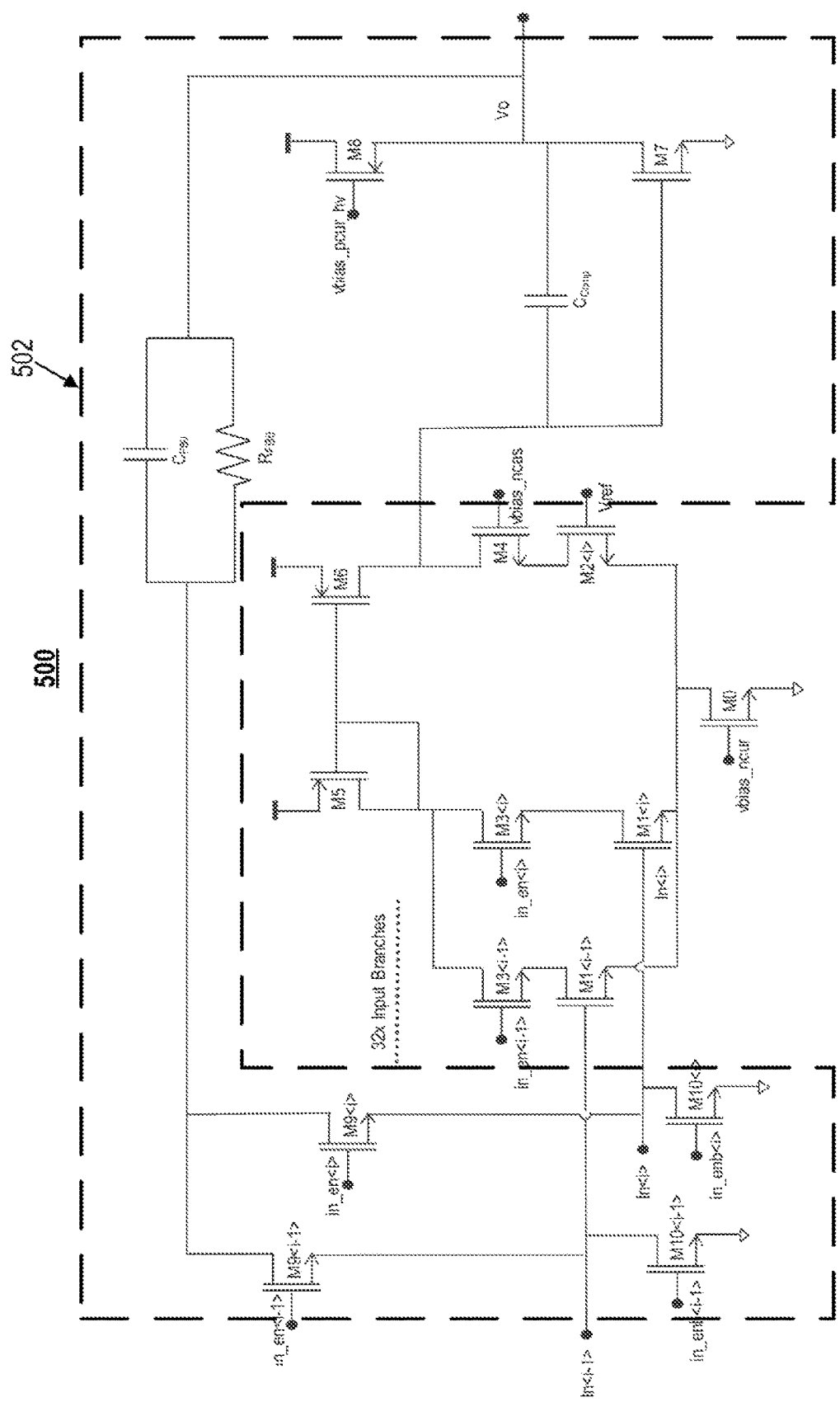
FIG. 5 illustrates a circuit diagram of an exemplary optical signal detection circuit having a multi-channel amplifier and a feedback network, according to embodiments of the disclosure.

FIG. 5 shows an optical signal detection circuit 500 having a feedback network 502 according to embodiments of the disclosure. Feedback network 502 may include a plurality of feedback branches connected in parallel. The plurality of feedback branches may be electrically connected to inverting input branch 410 of operational amplifier 306 (e.g., the differential inverting input V_) to further control and stabilize the gain $A_g$ of operational amplifier 306. In some embodiments, feedback network 502 may include, among other things, a resistor-capacitor network for filtering out unwanted signals, and N parallel branches each of which includes a first switch M9 and a second switch M10. In some embodiments, switches M9 and M10 may be at least one of a NMOS or a PMOS device. In some embodiments, switches M9 and M10 can be of the same type (e.g., M9 and M10 both are NMOS or PMOS), or switches M9 and M10 can be of different types (e.g., M9 can be NMOS and M10 can be PMOS or vice versa). For example, each of the N parallel branches are electrically connected to one of the N-input channels (e.g., the node at the "gate" terminal of input transistor 404).

When the switch 406' connected in series with the input transistor in the same input branch turns on, the electrical signal 218 at the gate terminal of input transistor 404' may be selected for amplification. Switches 406 of the input branches can turn on one at a time to control the selection of the corresponding input transistor 404, thereby establishing the connection between the corresponding photodetector and the amplifier. Switch M9 of that input branch turns on and M10 of that input branch turns off. As a result, a feedback branch is formed for that input branch. On the other hand, the rest of the branches of the N-input channels, switch 406 of which is off, the switch M9 of that branch will be off and the switch M10 of that branch will be on. Consequently, the branch that switch 406 is off will be divided to be held to the ground through the switch M10 of that branch or, in some other embodiments, be held to a buffer through the switch M10 of that branch.

Figure 6:
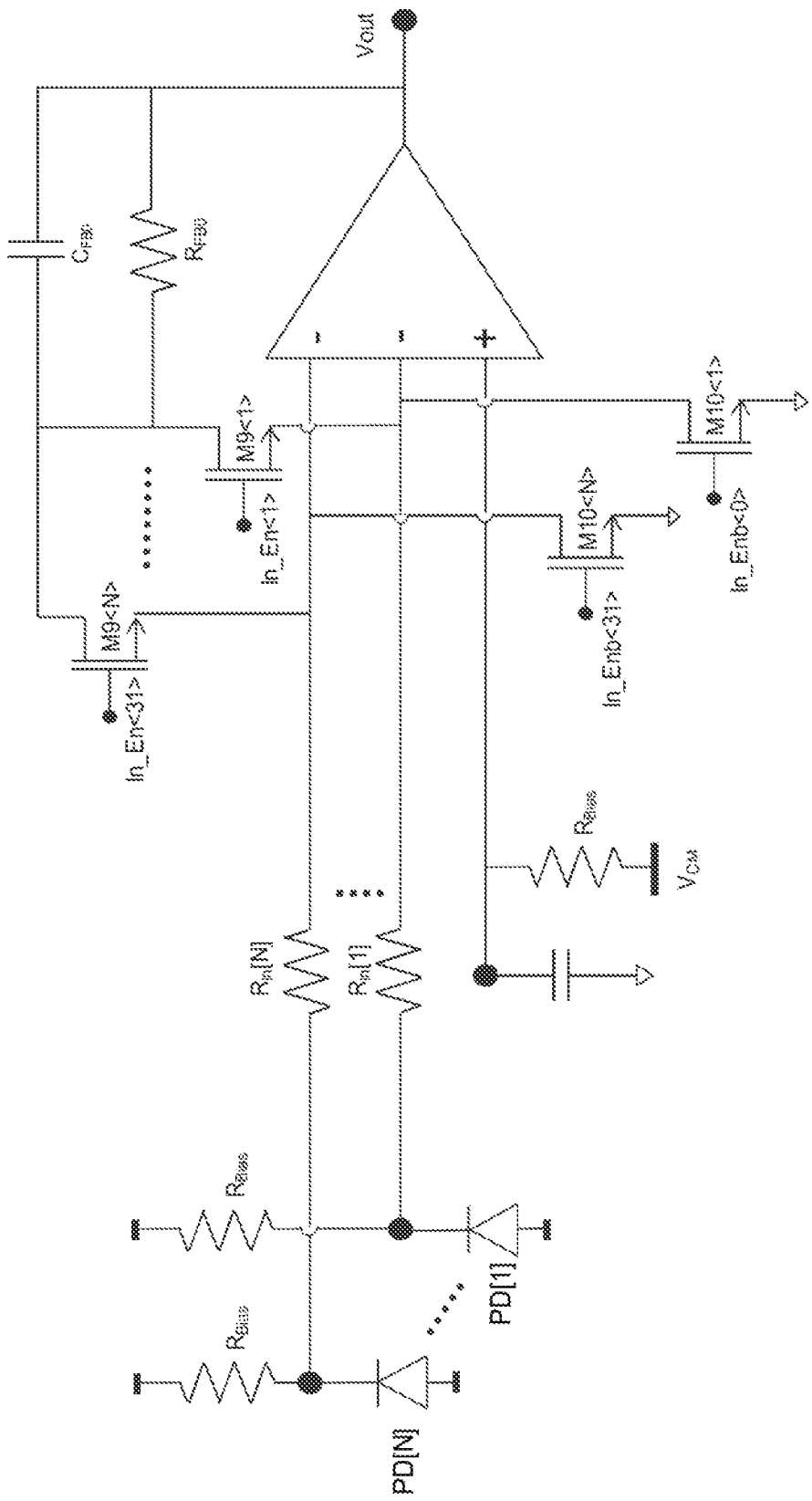
FIG. 6 illustrates a circuit diagram of an exemplary optical signal detection circuit having a multi-channel amplifier for voltage sensing, according to embodiments of the disclosure.

FIG. 6 illustrates a circuit diagram of an exemplary optical signal detection circuit 600 having a multi-channel amplifier for voltage sensing, according to embodiments of the disclosure. In some embodiments, as illustrated in FIG. 6, the inputs from photodetectors of photodetector array 302 may be voltage signals. For example, each of the N-input channels may include a resistor $R_{in}$ and the feedback network may include a resistor $R_{Bias}$. By adjusting the value of the resistor $R_{in}$ and $R_{Bias}$, Circuit 600 may convert the voltage signal into a current signal and process the current signal in a manner similar to the manner disclosed in the above embodiments.

Figure 7:
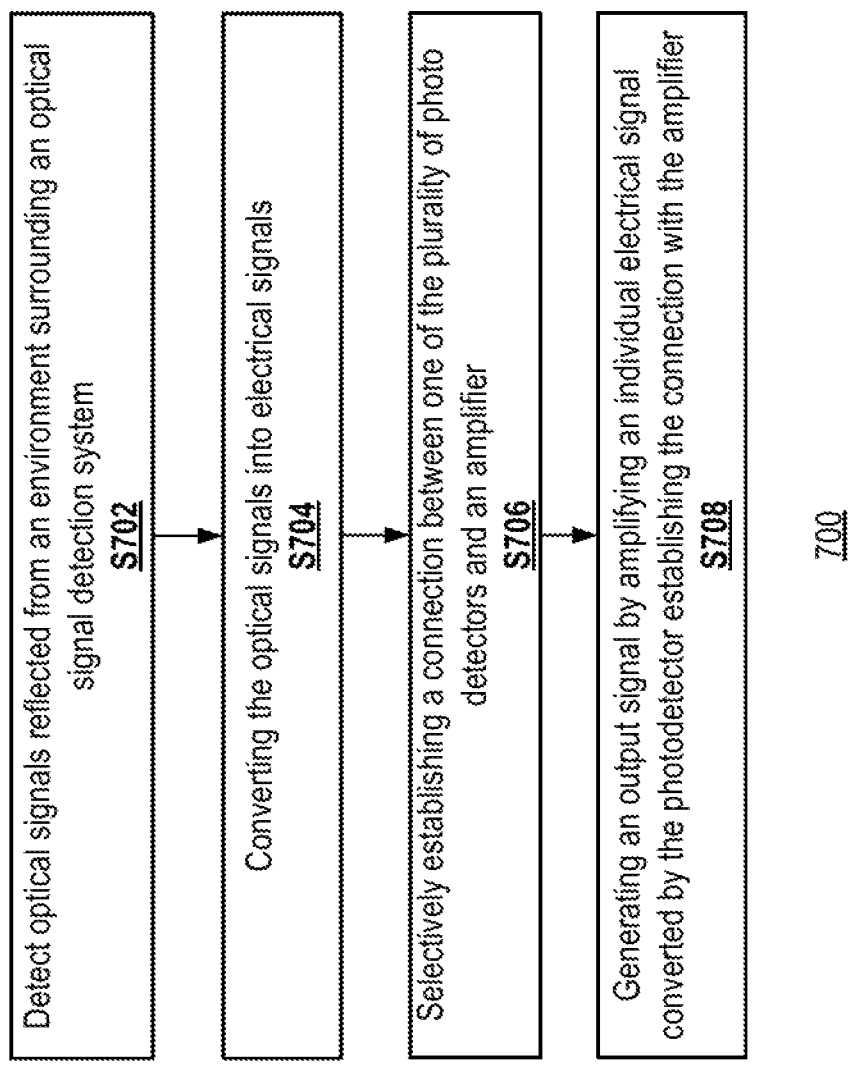
FIG. 7 illustrates a flow chart of an exemplary method for processing optical signals, according to embodiments of the disclosure.

FIG. 7 illustrates a flow chart of an exemplary method for processing optical signals, according to embodiments of the disclosure. In step S702, the optical signals reflected from an environment surrounding an optical signal detection system (e.g., light photons of returned laser beam 211 reflected by object 212) may be detected by a plurality of photodetectors (e.g., an avalanche photodiode array or a silicon photo multiplier or photodetector array 302) of receiver 204.

In step S704, the optical signal (e.g., the received light) may be converted into electrical signals (e.g., a current signal or a voltage signal) by the plurality of photodetectors. For example, photodetector array 302 may generate current when photons are absorbed in the photodiode of the photodetector. Photodetector array 302 may then transmit the electrical signal (e.g., electrical signal 218) to a multiplexing circuit (e.g., multiplexer 304) as the input of the multiplexing circuit.

In step S706, the multiplexing circuit may selectively establish a connection between one of the photodetectors in photodetector array 302 and an amplifier (e.g., operational amplifier 306). For example, the multiplexing circuit may include a modified N-input branches and a differential current output that compares the single output of the multiplexing circuit (e.g., a multiple input-single output circuit) and an inverting input of the amplifier. In some embodiments, each of the N input branches may include an input transistor (e.g., a first switch) electrically connected to each one of the photodetectors within photodetector array 302, and a second switch for controlling the on and off of each of the N-input branches. The N-input branches are electrically connected in parallel to each other. The single output of multiplexing circuit may be used as one input for operational amplifier 306 (e.g., one of the differential input $V_+$) for further process.

In step S708, an output signal may be generated by the amplifier amplifying the electrical signal converted by the selected photodetector (e.g., the connecting switch of which is turned on). For example, the amplifier (e.g., operational amplifier 306) may take the output of the multiplexing circuit as one of its non-inverting input (e.g., the differential non-inverting input $V_+$) and take another inverting input (e.g., the differential inverting input $V_-$) holding at the ground or a buffer for further controlling and stabilizing purpose (e.g., controlling the gain $A_g$ of the amplifier). The amplifier may then amplify the differential non-inverting input $V_+$ and inverting input $V_-$ by the gain $A_g$.

In some embodiments, the amplifier may be an open-loop amplifier where a very large magnitude of $A_g$ (e.g., a 100,000 times gain) is desired. The amplifier may include a resistor $R_{Bias}$ at the inverting or non-inverting input held at a reference voltage (e.g., $V_+/V_-=0$), and the input voltage applied to the other input may be amplified to the maximum extent (e.g., to the maximum positive if the input voltage is positive or to the maximum negative if the input voltage is negative). In these embodiments, the amplifier may act as a comparator comparing the electrical signal generated by the detector (e.g., electrical signal 218) and 0V. In some embodiments, the amplifier may be a close-loop amplifier that include a negative feedback, as discussed above in connection with FIG. 3.

In some embodiments, method 700 may further include feeding back the output signal of the amplifier to an output terminal of the at least one of the photodetectors when the multiplexing circuit establishes the connection between the at least one of the photodetectors and the amplifier. For example, a feedback network (e.g., feedback network 502) may be electrically connected to one of the N-input channels at the low impedance node (e.g., the node at the "source" terminal of the input transistor of the multiplexing circuit) to further control and stabilize the gain $A_g$ of amplifier. In some embodiments, the feedback network may include, among other things, a resistor-capacitor network for filtering out unwanted signals, and N parallel branches each of which includes first and second switches. The first and second switches may be arranged in parallel and are connected to a common point connected to the low impedance node (e.g., the node at the "source" terminal of the input transistor of the multiplexing circuit). In some embodiments, the first and second switch may be at least one of a NMOS or a PMOS device. For example, each of the N parallel branches of the feedback network may be electrically connected to one of the N-input channels at the low impedance node (e.g., the node at the "source" terminal of the input transistor of the multiplexing circuit). When the input transistor of one of the N-input channels the is selected to be on (e.g., establishing the connection between the corresponding photodetector and the amplifier), the first switch of the branch can be turned on and the second switch of the branch can be turned be off. As a result, a feedback branch for the input branch of that branch would be formed. On the other hand, the first switch of the rest of the branches of the N-input channels can be turned off, and the second switch of that branch can be turned be on. Consequently, the branch that will be divided to be held to the ground or to a buffer through the second switch of that branch.

It will be apparent to those skilled in the art that various modifications and variations can be made to the disclosed system and related methods. Other embodiments will be apparent to those skilled in the art from consideration of the specification and practice of the disclosed system and related methods.

It is intended that the specification and examples be considered as exemplary only, with a true scope being indicated by the following claims and their equivalents.

The invention claimed is:

1. An optical signal detection system, comprising:
a plurality of photodetectors configured to detect optical signals reflected from an environment surrounding the optical signal detection system and convert the optical signals into electrical signals;
an amplifier coupled to the plurality of photodetectors, wherein the amplifier is shared by the plurality of photodetectors and configured to generate an output signal by amplifying an individual electrical signal converted by a corresponding photodetector; and
a multiplexing circuit configured to selectively establish a connection between one of the plurality of photodetectors and the amplifier to amplify the electrical signal converted by that photodetector.

2. The optical signal detection system of claim 1, wherein the amplifier comprises a plurality of input branches arranged in parallel, each of the plurality of input branches being coupled to one of the plurality of photodetectors.

3. The optical signal detection system of claim 2, wherein the multiplexing circuit comprises a plurality of switches, at least one of the plurality of switches is arranged in one of the plurality of input branches and configured to control the connection between one of the plurality of photodetectors and the amplifier.

4. The optical signal detection system of claim 3, wherein the at least one of the plurality of switches is connected in series with an input transistor configured to couple one of the plurality of photodetectors to the amplifier.

5. The optical signal detection system of claim 3, wherein the at least one of the plurality of switches comprises an N-type metal-oxide-semiconductor field-effect transistor or a P-type metal-oxide-semiconductor field-effect transistor.

6. The optical signal detection system of claim 2, wherein the plurality of input branches are connected to a low-impedance node of the amplifier.

7. The optical signal detection system of claim 1, wherein the electrical signals comprise at least one of a voltage signal or a current signal.

8. The optical signal detection system of claim 1, comprising:
a feedback network comprising a plurality of feedback branches connected in parallel, at least one of the plurality of feedback branches comprising a pair of switches connected in series, wherein an output terminal of the at least one of the photodetectors is connected between the pair of switches.

9. The optical signal detection system of claim 8, wherein the pair of switches are configured to:
feedback the output signal to the output terminal of the at least one of the photodetectors when the multiplexing circuit establishes the connection between the at least one of the photodetectors and the amplifier; and
ground the output terminal of the at least one of the photodetectors when the multiplexing circuit does not establish the connection between the at least one of the photodetectors and the amplifier.

10. A method of processing optical signals, comprising:
detecting, by a plurality of photodetectors, the optical signals reflected from an environment surrounding an optical signal detection system;
converting, by the plurality of photodetectors, the optical signals into electrical signals;
selectively establishing, by a multiplexing circuit, a connection between one of the plurality of photodetectors and an amplifier, wherein the amplifier is coupled to and shared by the plurality of photodetectors; and
generating, by the amplifier, an output signal by amplifying an individual electrical signal converted by the photodetector establishing the connection with the amplifier.

11. The method of claim 10, wherein the amplifier comprises a plurality of input branches arranged in parallel, each of the plurality of input branches being coupled to one of the plurality of photodetectors.

12. The method of claim 11, further comprising:
controlling, by a switch of the multiplexing circuit, the connection between one of the plurality of photodetectors and the amplifier, wherein the switch is arranged in one of the plurality of input branches of the amplifier.

13. The method of claim 11, wherein the plurality of input branches are connected to a low-impedance node of the amplifier.

14. The method of claim 10, comprising:
feeding back, by a feedback network, the output signal to an output terminal of the photodetector establishing the connection with the amplifier.

15. The method of claim 10, comprising:
grounding the output terminal of the photodetector when the multiplexing circuit does not establish the connection between the photodetector and the amplifier.

16. A multi-channel operational amplifier circuit, comprising:
a plurality of input channels configured to receive input signals generated by a plurality of photodetectors;
an amplification unit coupled to the plurality of photodetectors through the plurality of input channels, wherein the amplification unit is shared by the plurality of input channels and configured to generate an output signal by amplifying an individual input signal received by a corresponding input channel; and
a multiplexing circuit configured to select one of the plurality of input channels for the amplification unit to amplify the input signal received by that input channel.

17. The multi-channel operational amplifier circuit of claim 16, wherein the amplification unit comprises a plurality of input branches arranged in parallel, each of the plurality of input branches being coupled to one of the plurality of input channels.

18. The multi-channel operational amplifier circuit of claim 16, wherein the multiplexing circuit comprises a plurality of switches, at least one of the plurality of switches being configured to control the selection of the one of the plurality of input channels.

19. The multi-channel operational amplifier circuit of claim 18, wherein the at least one of the plurality of switches is connected in series with an input transistor configured to couple one of the plurality of photodetectors to the amplification unit.

20. The multi-channel operational amplifier circuit of claim 17, wherein the plurality of input branches are connected to a low-impedance node of the amplification unit.

* * * * *